(12) United States Patent
Chee et al.

(10) Patent No.: US 8,217,699 B2
(45) Date of Patent: Jul. 10, 2012

(54) APPARATUS FOR GENERATING A PLURALITY OF SIGNALS

(75) Inventors: Piew Yoong Chee, Singapore (SG); Wing Fai Loke, Singapore (SG); Yan Wah Michael Chia, Singapore (SG); Jee Khoi Yin, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 12/528,308

(22) PCT Filed: Feb. 22, 2008

(86) PCT No.: PCT/IB2008/000394
§ 371 (c)(1),
(2), (4) Date: Nov. 4, 2009

(87) PCT Pub. No.: WO2008/102246
PCT Pub. Date: Aug. 28, 2008

(65) Prior Publication Data
US 2010/0315145 A1    Dec. 16, 2010

Related U.S. Application Data

(60) Provisional application No. 60/891,197, filed on Feb. 22, 2007.

(51) Int. Cl.
*G06F 1/04* (2006.01)
(52) U.S. Cl. .................................................. 327/295
(58) Field of Classification Search .................. 327/295
See application file for complete search history.

(56) References Cited

U.S. PATENT DOCUMENTS
7,525,354 B2 * 4/2009 Gomm et al. ................. 327/158
2005/0140416 A1  6/2005 Rashid FOREIGN PATENT DOCUMENTS
EP       1093228 A    4/2001
GB       2405273 A    2/2005

OTHER PUBLICATIONS

International Search Report, in connection with PCT/IB2008/000394, mailed Aug. 7, 2008, 3 pages. Written Opinion of the International Searching Authority, in connection with PCT/IB2008/000394, mailed Aug. 7, 2008, 4 pages.

* cited by examiner

*Primary Examiner* — Lincoln Donovan
*Assistant Examiner* — Daniel Rojas
(74) *Attorney, Agent, or Firm* — Fliesler Meyer LLP

(57) ABSTRACT

An apparatus for generating a plurality of signals is provided. The apparatus provided includes a first signal generation unit, including an input receiving a reference signal, and a plurality of outputs providing a first plurality of output signals being generated based on the reference signal, wherein any two of the output signals have a different phase. The apparatus provided further includes a second signal generation unit, including at least two inputs receiving at least two signals selected from the first plurality of output signals generated by the first signal generation unit, and a plurality of outputs providing a second plurality of output signals generated by interpolating the respective phases of the received at least two signals selected from the first plurality of output signals. The apparatus provided further includes a selection unit, including a first plurality of inputs receiving the first plurality of output signals generated by the first signal generation unit, a second plurality of inputs receiving the second plurality of output signals generated by the second signal generation unit, and a plurality of outputs providing the plurality of signals wherein each of the signals is selected from the first plurality of output signals generated by the first signal generation unit and the second plurality of output signals generated by the second signal generation unit, wherein any two signals of the plurality of signals have a different phase.

19 Claims, 10 Drawing Sheets

APPARATUS FOR GENERATING A PLURALITY OF SIGNALS

The present application claims the benefit of U.S. provisional application 60/891,197 (filed on 22 Feb. 2007), the entire contents of which are incorporated herein by reference for all purposes.

FIELD OF THE INVENTION

Embodiments of the invention relate to the field of electronic systems, such as communication systems using antennas, for example. By way of example, embodiments of the invention relate to an apparatus for generating a plurality of signals and a method of generating a plurality of signals, as well as a corresponding communication device.

BACKGROUND OF THE INVENTION

The use of a clock (or reference) signal is common in any electronic system. Further, in more advanced electronic systems, such as communication systems using multiple antennas or antenna arrays, for example, clock signals of the same frequency but with different phases (or multiphase clock signals) are required.

There are conventional methods available for generating multiphase clock signals.

A first conventional method to generate multiphase clock signals would be to use a plurality of phase lock loop circuits. As used herein, the term plurality refers to two or more. In this context, a plurality of phase lock loop circuits means two or more phase lock loop (PLL) circuits.

A second conventional method to generate multiphase clock signals would be to use a plurality of delay lock loop (DLL) circuits. It can be seen that the second conventional method may be derived from the first conventional method by merely replacing the PLL circuits used with DLL circuits.

A third conventional method to generate multiphase clock signals would be to use a plurality of phase interpolator circuits. In this conventional method, a first phase delayed clock signal may be generated based on an input clock signal. Subsequently, the plurality of phase interpolator circuits may be used to generate further a plurality of phase delayed clock signals based on the input clock signal and the first phase delayed clock signal.

In this document, an alternative method of generating multiphase clock signals is provided.

SUMMARY OF THE INVENTION

In one embodiment of the invention, an apparatus for generating a plurality of signals is provided. The apparatus provided includes a first signal generation unit, including an input receiving a reference signal, and a plurality of outputs providing a first plurality of output signals being generated based on the reference signal, wherein any two of the output signals have a different phase. The apparatus provided further includes a second signal generation unit, including at least two inputs receiving at least two signals selected from the first plurality of output signals generated by the first signal generation unit, and a plurality of outputs providing a second plurality of output signals being generated by interpolating the respective phases of the received at least two signals selected from the first plurality of output signals. The apparatus provided further includes a selection unit, including a first plurality of inputs receiving the first plurality of output signals generated by the first signal generation unit, a second plurality of inputs receiving the second plurality of output signals generated by the second signal generation unit, and a plurality of outputs providing the plurality of signals wherein each of the signals is selected from the first plurality of output signals generated by the first signal generation unit and the second plurality of output signals generated by the second signal generation unit, wherein any two signals of the plurality of signals have a different phase.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF THE INVENTION

Figure 1:
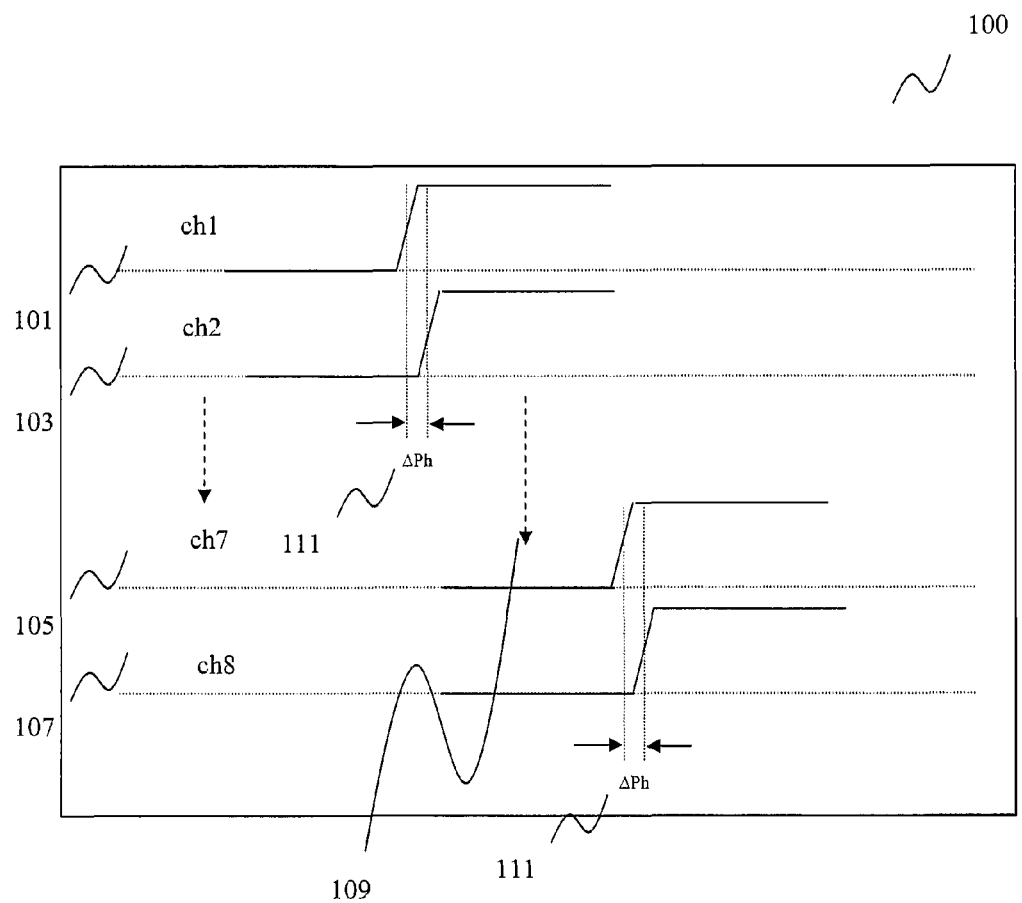
FIG. 1 shows an illustration of a plurality of signals generated according to one embodiment of the invention.

According to an embodiment of the invention, an apparatus for generating a plurality of signals is provided. The apparatus provided includes a first signal generation unit, including an input receiving a reference signal, and a plurality of outputs providing a first plurality of output signals being generated based on the reference signal, wherein any two of the output signals have a different phase. The apparatus provided further includes a second signal generation unit, including at least two inputs receiving at least two signals selected from the first plurality of output signals generated by the first signal generation unit, and a plurality of outputs providing a second plurality of output signals being generated by interpolating the respective phases of the received at least two signals selected from the first plurality of output signals. The apparatus provided further includes a selection unit, including a first plurality of inputs receiving the first plurality of output signals generated by the first signal generation unit, a second plurality of inputs receiving the second plurality of output signals generated by the second signal generation unit, and a plurality of outputs providing the plurality of signals wherein each of the signals is selected from the first plurality of output signals generated by the first signal generation unit and the second plurality of output signals generated by the second signal generation unit, wherein any two signals of the plurality of signals have a different phase.

In this embodiment, each signal of the plurality of signals may be, but is not limited to, a clock signal, a data signal, a periodic signal, a pseudorandom signal or a pulse signal, for example.

According to an embodiment of the invention, a method of generating a plurality of signals is provided. The method provided includes generating a first plurality of output signals based on a reference signal, wherein any two signals of the plurality of output signals have a different phase, and selecting at least two signals from the first plurality of output signals. The method provided further includes generating a second plurality of output signals by interpolating the respective phases of the selected at least two signals from the first plurality of output signals, and selecting the plurality of signals from the first plurality of output signals and the second plurality of output signals, wherein any two signals of the plurality of signals have a different phase.

Embodiments of the invention emerge from the dependent claims.

In one embodiment, the first plurality of output signals is generated such that there is a phase difference between any two signals of the first plurality of output signals, and that the minimum phase difference between any two signals of the first plurality of output signals is based on a first parameter value.

In another embodiment, the second plurality of output signals is generated such that there is a phase difference between any two signals of the second plurality of output signals, and that the minimum phase difference between any two signals of the second plurality of output signals is based on a second parameter value.

In one embodiment, the minimum phase difference between any two signals of the first plurality of output signals is greater than the minimum phase difference between any two signals of the second plurality of output signals. Accordingly, for example, the first parameter value is greater than the second parameter value. In another embodiment, the first parameter value and the second parameter value are programmable.

In one embodiment, the apparatus provided further includes a calibration unit, wherein the calibration unit is programmed to compensate the minimum phase difference between any two signals of the plurality of signals, such that the minimum phase difference is at least substantially the same as the parameter value corresponding to the signals selected by the selection unit.

In this embodiment, for example, if the second plurality of output signals were selected as the plurality of signals, then the minimum phase difference between any two signals of the plurality of signals should be about the same as the desired value, namely, the minimum phase difference between any two signals of the second plurality of output signals, which is based on the second parameter value.

However, due to device mismatches or process, voltage and temperature (PVT) variations along the different signal paths, for example, the minimum phase difference between any two signals of the plurality of signals may deviate from the desired value. In this context, the calibration unit is used to provide compensation to ensure the minimum phase difference between any two signals of the plurality of signals is about the same as the desired value, which is based on the second parameter value.

In another embodiment, the apparatus provided further includes a buffering unit, wherein the buffering unit is adapted to control the slew rate of the plurality of signals, such that the rise/fall times of the plurality of signals are at least substantially the same as a predefined value.

In one embodiment, the second signal generation unit includes at least one phase interpolating circuit. In another embodiment, the second signal generation unit includes a plurality of phase interpolating circuits which are connected in series.

The number of phase interpolating circuits used depends on the desired minimum phase difference between any two signals of the second plurality of output signals. In this context, if a larger minimum phase difference between any two signals of the second plurality of output signals is desired, then the number of phase interpolating circuits used may be small. On the other hand, if a smaller minimum phase difference between any two signals of the second plurality of output signals is desired, then the number of phase interpolating circuits used should be higher.

Figure 3:
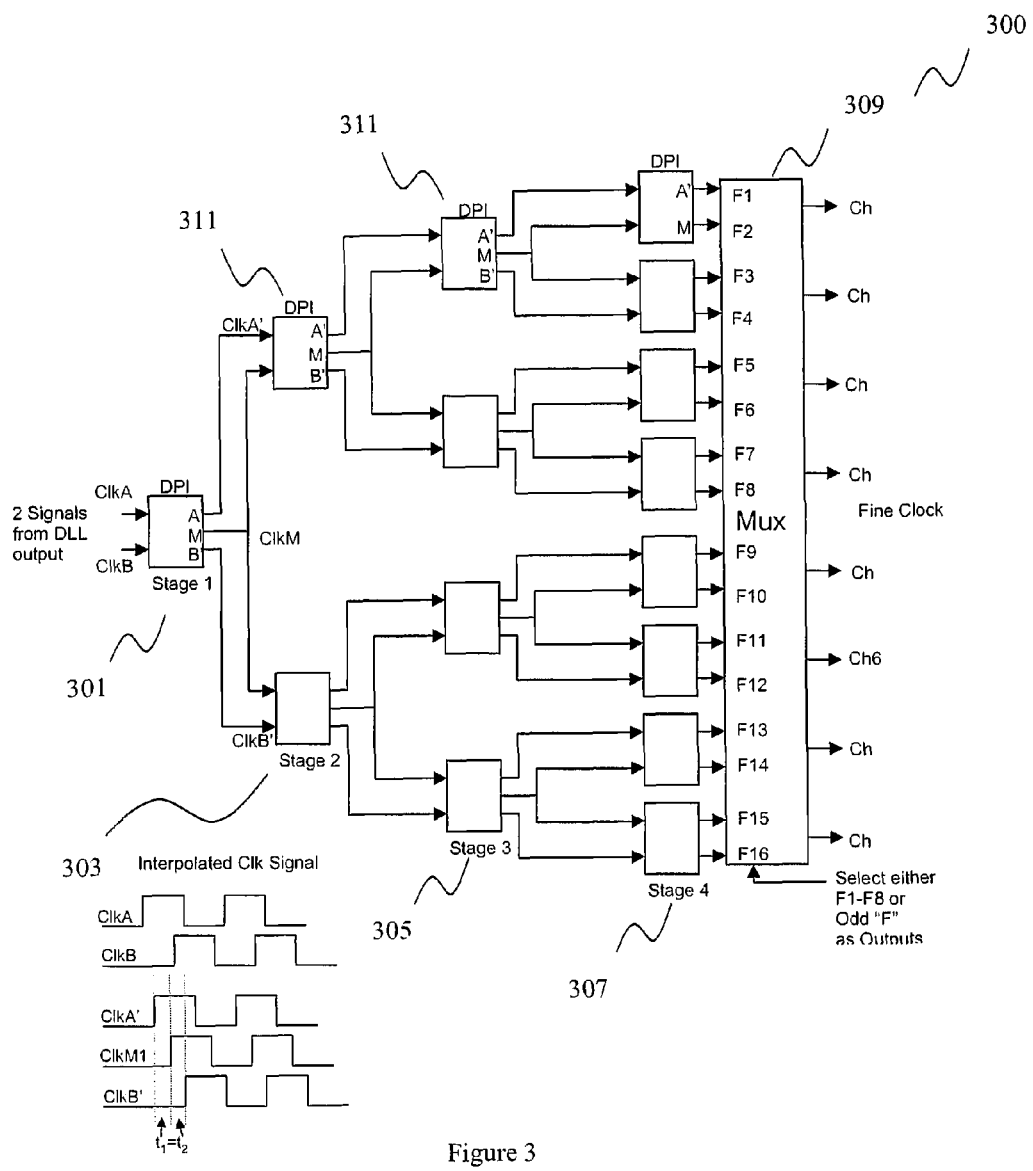
FIG. 3 shows a block diagram of the digital phase interpolation (DPI) unit according to one embodiment of the invention.

In the illustrative example shown in FIG. 3, the number of phase interpolating circuits used is 15, which are arranged into 4 stages. This means that there are 4 phase interpolating circuits along any path from the input of the second signal generation unit to any output of the second signal generation unit. With such a design, the minimum phase difference between any two signals of the second plurality of output signals obtained is about $1/16$ of the phase difference between the two signals at the inputs of the second signal generation unit.

In one embodiment, the plurality of signals of the selection unit is provided to an antenna beamforming unit.

In one embodiment, the number of output signals in the first plurality of output signals is the same as the number of output signals in the second plurality of output signals.

In one embodiment, the first signal generation unit includes a delay lock loop circuit. In another embodiment, the first signal generation unit includes a phase lock loop circuit.

In one embodiment, the selection unit includes a multiplexer circuit.

In one embodiment, a communication device is provided, wherein the communication device provided includes the apparatus for generating the plurality of signals.

In one embodiment, the method provided further includes compensating the minimum phase difference between any two signals of the plurality of signals, such that the minimum phase difference is substantially the same as the parameter value corresponding to the selected plurality of signals.

In one embodiment, the method provided further includes controlling the slew rate of the plurality of signals, such that the rise/fall times of the plurality of signals are at least substantially the same as a predefined value.

In one embodiment, the method provided further includes providing the plurality of signals to an antenna beamforming unit.

The embodiments which are described in the context of the apparatus for generating a plurality of signals are analogously valid for the method for generating a plurality of signals, and the respective communication devices, and vice versa.

FIG. 1 shows an illustration of a plurality of signals 100 generated according to one embodiment of the invention.

The plurality of signals 100 includes a first signal 101, a second signal 103, a seventh signal 105 and an eighth signal 107. The arrow 109 is used in this illustration to represent other signals which are not shown, including a third signal, a fourth signal, a fifth signal and a sixth signal.

In this illustration, the phase difference 111 between the first signal 101 and the second signal 103 has about the same value as the phase difference 111 between the seventh signal 105 and the eighth signal 107. Similarly, the value of the phase difference 111 is also about the same as that of the phase difference between the second signal 103 and the third signal, the phase difference between the third signal and the fourth signal, the phase difference between the fourth signal and the fifth signal, the phase difference between the fifth signal and the sixth signal and the phase difference between the sixth signal and the seventh signal 105.

According to one embodiment of the invention, the value of the phase difference 111 may be based on a parameter. In one embodiment, this parameter may be a programmable parameter, i.e. the value of this parameter may be set within a certain range.

Further, each signal of the plurality of signals may be, but is not limited to, a clock signal, a data signal, a periodic signal, a pseudorandom signal or a pulse signal, for example.

Figure 2:
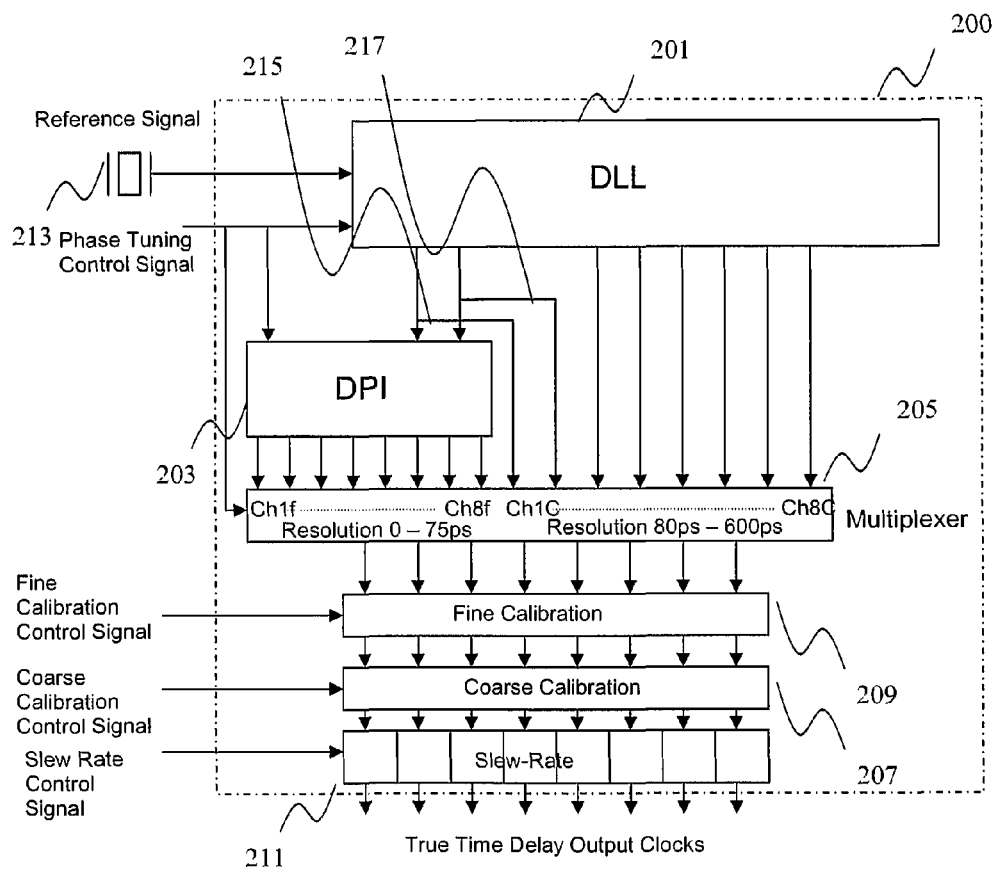
FIG. 2 shows a block diagram of an apparatus for generating a plurality of signals according to one embodiment of the invention.

FIG. 2 shows a block diagram of an apparatus 200 for generating a plurality of signals according to one embodiment of the invention.

The apparatus 200 may be used to generate a plurality of N equally phase shifted (or time delayed) signals, for example, for use in antenna beamforming applications. In this illustrative example, eight (N=8) equally phase shifted signals are generated (for example, as shown in FIG. 1).

Illustratively, the apparatus 200 receives a reference signal and generates eight output signals of the same frequency from it which are equally phase shifted (or spaced) in the time domain. The amount of phase shift (or minimum phase difference) or its equivalent in time delay may be digitally programmed from 0 to 500 picoseconds (PS) via phase tuning control signals.

In this context, the phase shift is related to the time delay in that the phase shift may be given by the time delay multiplied by the frequency of the output signal and by a factor of $2\pi$.

The apparatus 200 includes a delay lock loop (DLL) unit 201, a digital phase interpolator (DPI) unit 203, and a multiplexer unit 205. The apparatus 200 further includes a coarse calibration unit 207, a fine calibration unit 209, a buffer unit 211 and a reference clock unit 213.

The delay lock loop (DLL) unit 201 receives a reference signal from the reference clock unit 213, and generates a first plurality of output signals. In this illustration, it can be seen that the number of output signals generated by the delay lock loop (DLL) unit 201 is 8.

Further, as an illustrative example, the reference signal from the reference clock unit 213 may have a frequency in the range of about 10 MHz to about 100 MHz.

In one embodiment, the first plurality of output signals is generated such that there is a phase difference between any two signals of the first plurality of output signals, and that the minimum phase difference between any two signals of the first plurality of output signals is based on a first parameter value, e.g. a programmable time delay.

As an alternative implementation, the delay lock loop (DLL) unit may be replaced by a phase lock loop (PLL) unit instead, for example.

The digital phase interpolator (DPI) unit 203 receives at least two signals from the first plurality of output signals generated by the delay lock loop (DLL) unit 201, and generates a second plurality of output signals. The second plurality of output signals are generated by the digital phase interpolator (DPI) unit 203 by interpolating the respective phases of the received at least two signals from the first plurality of output signals.

Further, in this illustration, it can be seen that the number of signals (from the first plurality of output signals) received by the digital phase interpolator (DPI) unit 203 is 2. Additionally, it can also be seen that the number of output signals generated by the digital phase interpolator (DPI) unit 203 is 8.

In one embodiment, the second plurality of output signals is generated such that there is a phase difference between any two signals of the second plurality of output signals, and that the minimum phase difference between any two signals of the second plurality of output signals is based on a second parameter value, e.g. a programmable time delay.

Further, in another embodiment, the first parameter value is greater than the second parameter value. In other words, it may be considered that the delay lock loop (DLL) unit 201 generates a plurality of output signals with a "coarse" minimum phase difference and that the digital phase interpolator (DPI) unit 203 generates a plurality of output signals with a "fine" minimum phase difference.

In this context, as an illustrative example, the delay lock loop (DLL) unit 201 may generate the first plurality of output signals with a time delay of about 80 picoseconds (ps) to 600 ps in steps of 5 ps (or "coarse" time delay), while the digital phase interpolator (DPI) unit 203 may generate the second plurality of output signals with a time delay of about 0 picoseconds (ps) to 75 ps in steps of 5 ps (or "fine" time delay).

In view of the above, the first parameter may be the minimum phase difference value corresponding to the time delay in the range of about 80 picoseconds (ps) to about 600 ps in steps of about 5 ps. Alternatively, the first parameter may be the time delay value itself, since there is a relationship between the time delay and the minimum phase difference. Likewise, the second parameter may be the minimum phase difference value corresponding to the time delay in the range of about 0 ps to about 75 ps in steps of about 5 ps, or the time delay value itself.

In more detail, the phase shifting control may be carried out using the Delay Lock Loop (DLL) unit 201, for example. Illustratively, in the locked condition, a total time delay of 10 Variable Delay Cells may be set to be equal to a time delay value of the Reference Delay.

In this context, the Reference Delay may be programmed externally in the range from about 800 ps to about 6000 ps in the time step of about 50 ps, for example. The time delay between the signals (ch1c-ch8c), ΔPh (see FIG. 1, for example), may be in the range from about 80 ps to about 600 ps in the time step of about 5 ps, for example.

For a time delay below 80 ps, the digital phase interpolator (DPI) unit 203 may be used to interpolate the selected output signals from the first plurality of output signals in order to obtain the second plurality of output signals with a "fine" time delay. The implementation of the digital phase interpolator (DPI) unit 203 will be discussed in more detail later in relation to FIG. 3.

The multiplexer unit 205 receives the first plurality of output signals generated by the delay lock loop (DLL) unit 201 (see, for example, signals ch1c-ch8c in FIG. 2) and the second plurality of output signals generated by the digital phase interpolator (DPI) unit 203 (see, for example, signals ch1f-ch8f shown in FIG. 2), and then select the plurality of signals from the received first plurality of output signals and second plurality of output signals.

In the illustrative example shown in FIG. 2, the multiplexer unit 205 selects the plurality of signals from either the first plurality of output signals (with "coarse" time delay) or the second plurality of output signals (with "fine" time delay).

The coarse calibration unit 207 and the fine calibration unit 209 work together (as a calibration unit), in order to compensate the time delay errors in the plurality of signals (at the output of the multiplexer unit 205). The time delay errors may be caused by device impedance mismatches, layout mismatches, or bonding wire mismatches, for example. The implementation of the coarse calibration unit 207 and the fine calibration unit 209 will be discussed in more detail later in relation to FIG. 4.

The buffer unit 211 may be used to control the slew rate of the plurality of signals, so that the rise/fall times of the plurality of signals are about the same as the desired value.

Illustratively, with the buffer unit 211, the rise time of the plurality of signals may be programmable to be in the range from about 100 ps to about 5000 ps. Further, the buffer unit 211 may be designed to drive a high impedance load of about 50Ω/10 pF load.

FIG. 3 shows a block diagram of the digital phase interpolation (DPI) unit 203 according to one embodiment of the invention.

In this illustrative example, the digital phase interpolation (DPI) unit 203 includes 4 digital phase interpolation (DPI) stages (namely, a DPI stage 1 unit (301), a DPI stage 2 unit (303), a DPI stage 3 unit (305) and a DPI stage 4 unit (307)) and a multiplexer 309.

As shown in FIG. 3, the DPI stage 1 unit (301) only has one DPI circuit 311, the DPI stage 2 unit (303) has 2 DPI circuits 311, the DPI stage 3 unit (303) has 4 DPI circuits 311 and the DPI stage 4 unit (303) has 8 DPI circuits 311.

The DPI circuit 311 includes 2 inputs (A and B) and 3 outputs (A', B' and M). The signal at output A' of the DPI circuit 311 is an exact copy of the signal at input A of the DPI circuit 311. Likewise, the signal at output B' of the DPI circuit 311 is an exact copy of the signal at input B of the DPI circuit 311. The signal at output M of the DPI circuit 311 is a phase interpolated signal generated from the signals at inputs A and B of the DPI circuit 311. In this illustration, the phase difference between the signals at outputs A' and M is about half of the phase difference between the signals at outputs A' and B'.

Let the time delay between the signals at inputs A and B of the DPI circuit 311 of the DPI stage 1 unit 301 be represented $\Delta_{ph}$. Therefore, the time delay between the signals at outputs A' and M of the DPI circuit 311 of the DPI stage 1 unit 301 is given by $\Delta_{ph}/2$.

Likewise, the time delay between the signals at outputs A' and M of any DPI circuit 311 of the DPI stage 2 unit 303 is given by $\Delta_{ph}/4$, the time delay between the signals at outputs A' and M of any DPI circuit 311 of the DPI stage 3 unit 305 is given by $\Delta_{ph}/8$ and the time delay between the signals at outputs A' and M of any DPI circuit 311 of the DPI stage 4 unit 307 is given by $\Delta_{ph}/16$.

As such, if the time delay between the signals at inputs A and B of the DPI circuit 311 of the DPI stage 1 unit 301 were 80 ps (i.e. $\Delta_{ph}$=80 ps), then the time delay between the signals at outputs A' and M of any DPI circuit 311 of the DPI stage 4 unit 307 would be 5 ps.

Next, the multiplexer 309 selects F1-F8 as the outputs, and as such, eight signals are output from the digital phase interpolation (DPI) unit 203, where the minimum time delay between any two output signals is 5 ps.

In a similar manner, if the time delay between the signals at inputs A and B of the DPI circuit 311 of the DPI stage 1 unit 301 were 600 ps (i.e. $\Delta_{ph}$=600 ps), then the time delay between the signals at outputs A' and M of any DPI circuit 311 of the DPI stage 4 unit 307 would be 37.5 ps.

Next, with the multiplexer 309 selecting odd "F" as the outputs (i.e., F1, F3, F5, F7, F9, F11, F13 and F15 being the selected outputs), eight signals are output from the digital phase interpolation (DPI) unit 203, where the minimum time delay between any two output signals is 75 ps (two times 37.5 ps).

As such, the four-stage digital phase interpolation (DPI) unit 203 described above may cover the time delay range from 5 ps to 75 ps with time step of 5 ps.

While the illustrative example (shown in FIGS. 2 and 3) shows a specific range of coarse time delay and a corresponding range of fine time delay, it can be seen that by varying the Reference Delay value range as well as the number of phase interpolating circuits used, both the coarse time delay range and the fine time delay range may be varied accordingly.

For example, the coarse time delay may be in the range from about 5 ps to 5 microseconds (μs). Similarly, the fine time delay may be in the range from about to 5 femtoseconds (fs) about 5 nanoseconds (ns).

Figure 4:
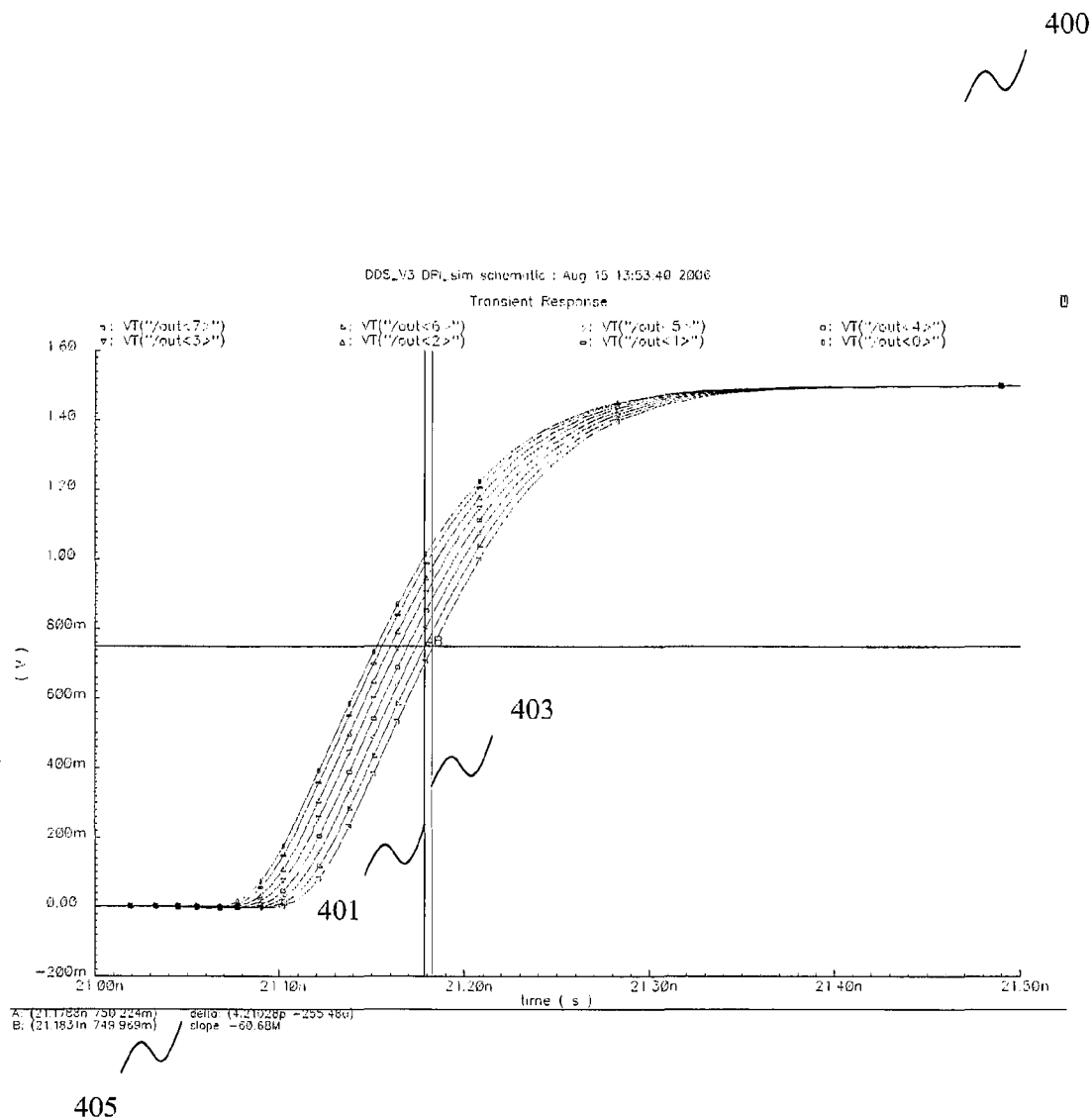
FIG. 4 shows a screen capture of the second plurality of output signals generated by the digital phase interpolation (DPI) unit according to one embodiment of the invention.

FIG. 4 shows a screen capture of the second plurality of output signals generated by the digital phase interpolation (DPI) unit 203 according to one embodiment of the invention.

It can be seen from FIG. 4 that the measured time delay between the two selected signals (denoted by line A 401 and line B 403) is only about 4.2 ps (as denoted by delta 405). As the measured time delay is smaller than the desired time delay of 5 ps, the time delay error (or difference between the measured time delay and the desired time delay) may be corrected by a calibration unit.

As mentioned earlier, the coarse calibration unit 207 and the fine calibration unit 209 work together (as a calibration unit), in order to compensate the time delay errors in the plurality of signals (at the output of the multiplexer unit 205).

The fine calibration unit 209 may be used to correct time delay errors of up to +/−10 ps at a resolution of 0.5 ps, for example. The coarse calibration unit 207 may be used to correct time delay errors up to +/−100 ps at a resolution of 10 ps, for example.

Further, the coarse calibration unit 207 and the fine calibration unit 209 may be connected in series. With such a connection, time delay errors of about +/−100 ps with a resolution of 0.5 ps may be corrected.

It should be noted that there would be one coarse calibration unit 207 and one fine calibration unit 209 connected to each signal in the plurality of signals, and each coarse calibration unit 207 and each fine calibration unit 209 may be programmed independently.

Figure 5:
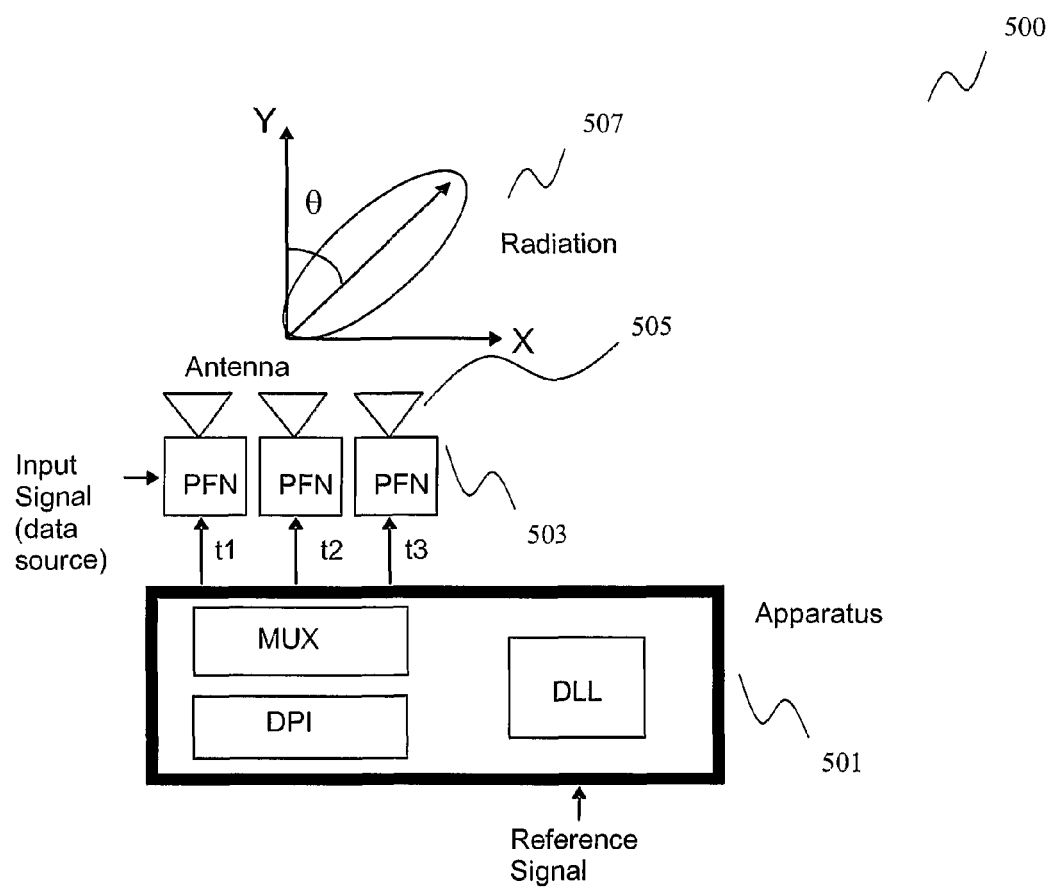
FIG. 5 shows a block diagram illustrating a first use of the apparatus for generating a plurality of signals, according to one embodiment of the invention.

FIG. 5 shows a block diagram 500 illustrating a first use of the apparatus for generating a plurality of signals, according to one embodiment of the invention.

The block diagram 500 shows an apparatus (for generating a plurality of signals) 501, a plurality of pulse forming networks (PFN) 503 and a plurality of antennas 505.

The apparatus 501 provides a plurality of signals to the plurality of pulse forming networks (PFN) 503, with one signal for each pulse forming network (PFN). Further, the plurality of pulse forming networks (PFN) 503 is connected to the plurality of antennas 505, such that one antenna is connected to each pulse forming network (PFN). Further, an antenna radiation pattern 507 may be generated by the system shown in the block diagram 500, for example.

The system shown in the block diagram 500 may be, but is not limited to, a Ultra-Wideband (UWB) beamforming system, a RFID beamforming system or a radar system, for example.

Figure 6:
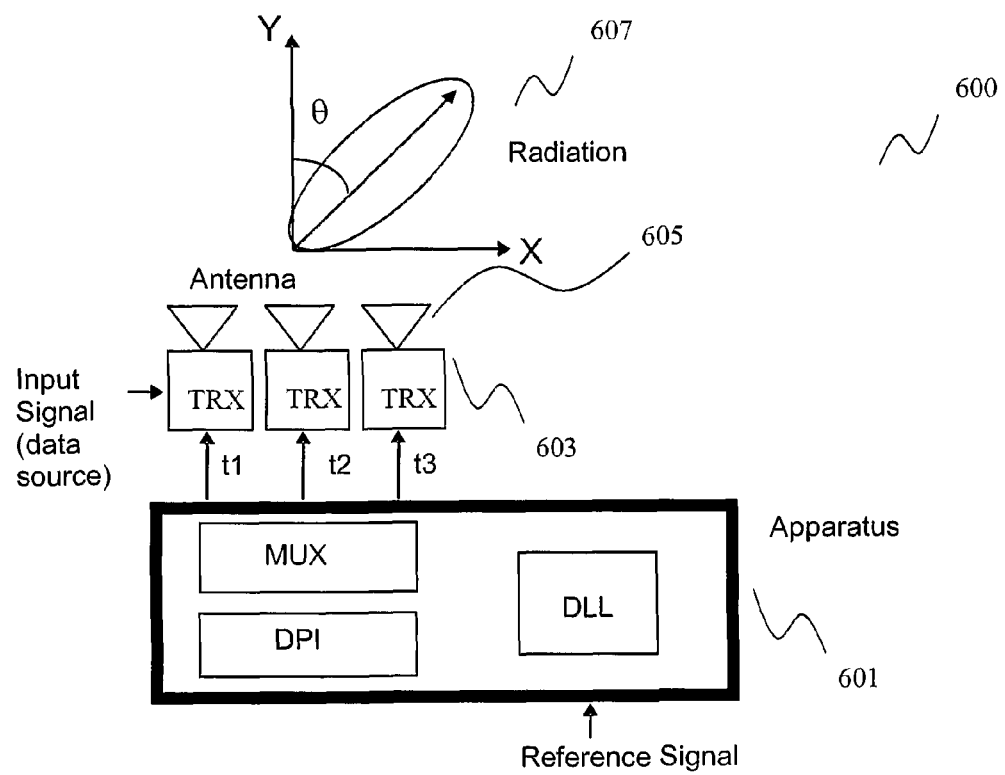
FIG. 6 shows a block diagram illustrating a second use of the apparatus for generating a plurality of signals, according to one embodiment of the invention.

FIG. 6 shows a block diagram 600 illustrating a second use of the apparatus for generating a plurality of signals, according to one embodiment of the invention.

The block diagram 600 shows an apparatus (for generating a plurality of signals) 601, a plurality of continuous wave (CW) direct conversion transceivers (TRX) 603 and a plurality of antennas 605.

The apparatus 601 provides a plurality of signals to the plurality of continuous wave (CW) direct conversion transceivers (TRX) 603, with one signal for each continuous wave (CW) direct conversion transceiver (TRX) 603. Further, the plurality of continuous wave (CW) direct conversion transceivers (TRX) 603 is connected to the plurality of antennas 605, such that one antenna is connected to each continuous wave (CW) direct conversion transceiver (TRX) 603. Further, an antenna radiation pattern 607 may be generated by the system shown in the block diagram 600, for example.

The system shown in the block diagram 600 may be, but is not limited to, a radio frequency integrated circuit (RFIC), for example.

Next, one implementation of the fine calibration unit 209 will be described.

Figure 7:
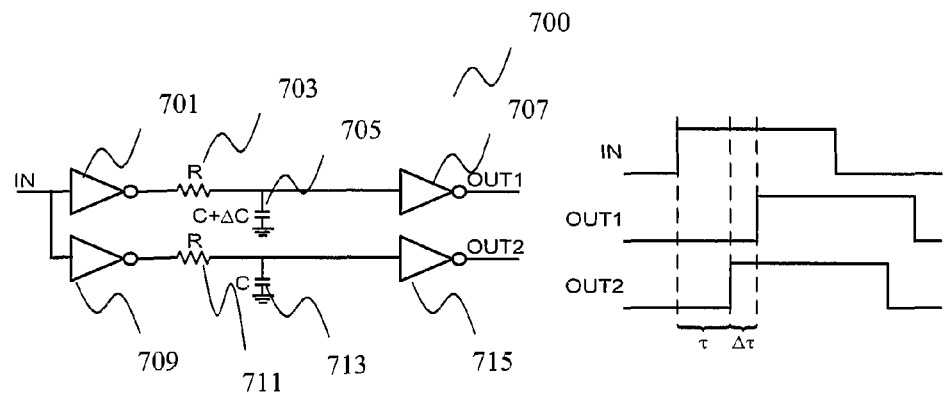
FIG. 7 shows a block diagram of the fine calibration unit according to one embodiment of the invention.

FIG. 7 shows a block diagram of the fine calibration unit 209 according to one embodiment of the invention.

As mentioned earlier, time delay errors may be caused by device impedance mismatches, layout mismatches, or bonding wire mismatches, for example. Further, the time delay errors may also be caused by process, voltage and temperature (PVT) variations along the different signal paths. These effects may be reduced using the fine calibration unit 209.

A conventional method of implementing the fine calibration unit 209 is by using a capacitor array. This method has been used to reduce the above mentioned mismatches and PVT variations. The capacitors used in the capacitor array may have about the same capacitive value or unique capacitive values.

However, the resolution for the time delay error compensation achieved by such a capacitor array is limited by factors such as the parasitic capacitance of the switch and metal connections, and the minimum capacitance of the capacitor. Typically, the resolution per bit achieved is about 1.2 ps.

In view of the above, if the fine calibration unit 209 is required to compensate the above mentioned mismatches and PVT variations along different signal paths, it should be noted that a relative delay may be used instead of an absolute delay.

As an illustrative example, as shown in FIG. 7, the fine calibration unit 209 may be implemented as a first signal path (from IN to OUT1) and a second signal path (from IN to OUT2). The first signal path includes a first inverter 701, a first resistor (R) 703, a first capacitor array (C) 705 and a second inverter 707. The second path includes a third inverter 709, a second resistor (R) 711, a second capacitor array (C) 713 and a fourth inverter 715.

For example, as shown in FIG. 7, the signal at OUT1 has an absolute delay of $\tau+\Delta\tau$ and the signal at OUT2 has an absolute delay of $\tau$. However, the time delay difference between the signals at OUT1 and OUT2 is only $\Delta\tau$. In this example, it can be seen that the relative delay of $\Delta\tau$ is contributed by $R(\Delta C)$. As a result, with the use of the relative delay, the parasitic capacitance contributions from the switches and metal connections may be eliminated in the fine calibration unit 209.

Figure 8:
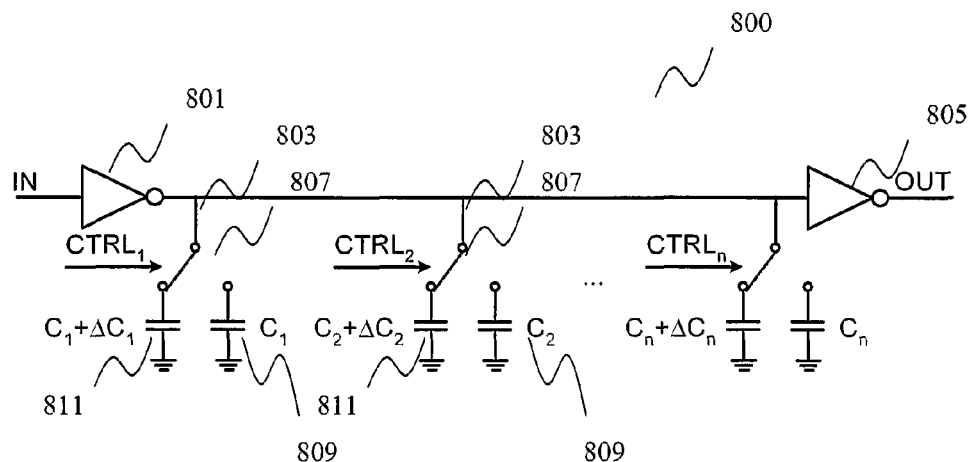
FIG. 8 shows a block diagram of a capacitor array according to one embodiment of the invention.

An illustrative example of an implementation of the first capacitor array 705 (and the second capacitor array 713) is shown in FIG. 8.

FIG. 8 shows a block diagram of a capacitor array 800 according to one embodiment of the invention.

The capacitor array 800 includes a first inverter 801, a plurality of capacitor stages 803 and a second inverter 805. Each capacitor stage 803 includes a switch 807, a first capacitor 809 and a second capacitor 811. In each capacitor stage 803, the switch 807 determines whether the first capacitor 809 or the second capacitor 811 would be connected as part of the capacitor array 800.

In the capacitor array 800, the switches and metal connections contribute to the total capacitance value of $\Sigma C_i$. If each switch 807 switches between the first capacitor 809 ($C_i$) and the second capacitor 811 ($C_i+\Delta C_i$), the relative delay between two signal paths will be only be affected by the capacitance value $\Delta C_i$.

Figure 9:
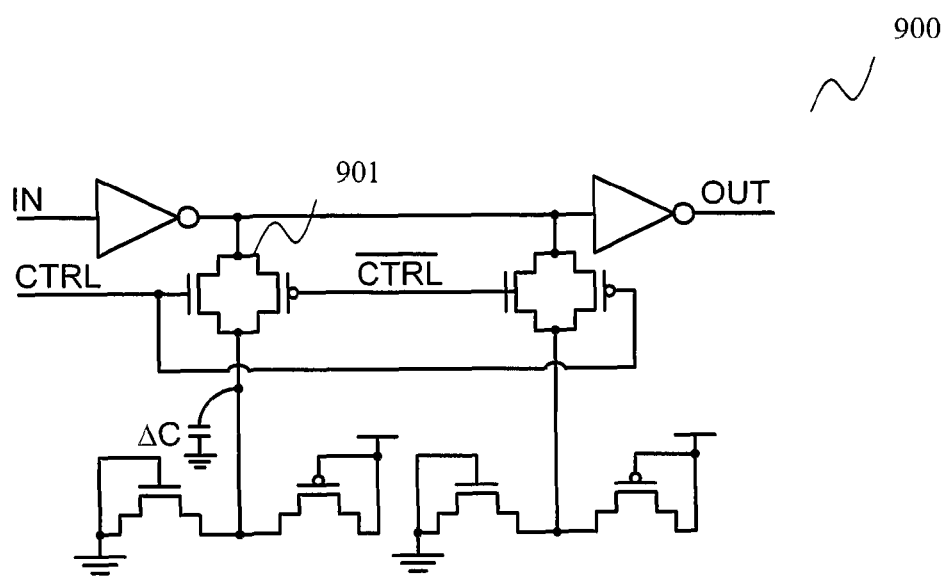
FIG. 9 shows a block diagram of the capacitor array showing an implementation of the switch according to one embodiment of the invention.

An illustrative example of an implementation of the switch 807 is shown in FIG. 9.

FIG. 9 shows a block diagram of the capacitor array 800 showing an implementation of the switch 807 according to one embodiment of the invention.

As shown in FIG. 9, the switch 807 may be implemented using as a transmission gate 901. As an illustrative example, the transmission gate 901 may be realized by a PMOS transistor and an NMOS transistor connected in parallel, or any circuit which performs a similar function.

Additionally, the capacitance value $\Delta C$ may be considered as a result of the overall capacitance difference. As such, $\Delta C$ may be the capacitance difference due to different metal routings, for example.

Figure 10:
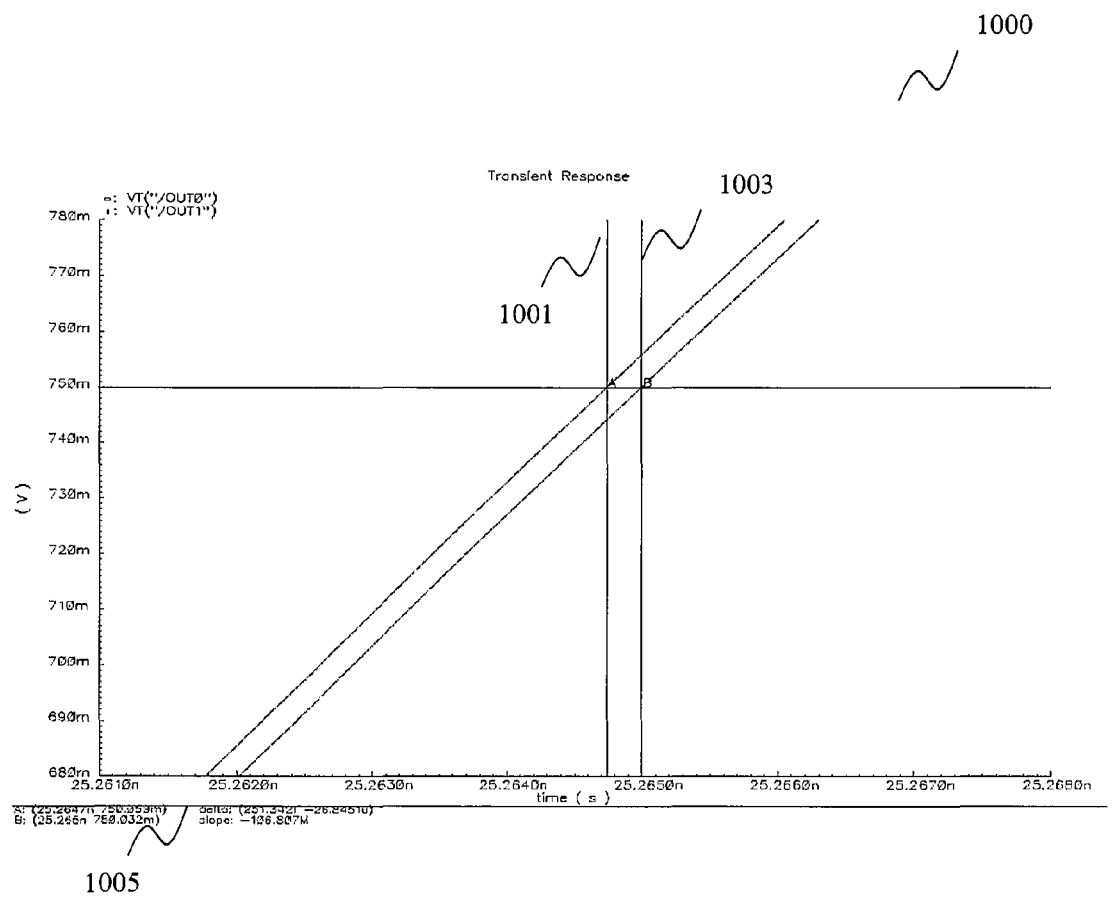
FIG. 10 shows the simulation results for the fine calibration unit based on the implementation of the switch of FIG. 9, according to one embodiment of the invention.

FIG. 10 shows the simulation results for the fine calibration unit 209 based on the implementation of the switch 807 of FIG. 9, according to one embodiment of the invention.

The simulations are carried out on the fine calibration unit 209 using the switch 807 implemented with $\Delta C_i$ as the gate capacitance of a pair of PMOS and NMOS transistors (as shown in FIG. 9).

It can be seen from FIG. 10 that the measured relative delay between the two signals (denoted by line A 1001 and line B 1003) is only about 251 femtoseconds (fs) (as denoted by delta 1005). As such, a relative delay of as low as about 251 fs may be achieved.

Figure 11:
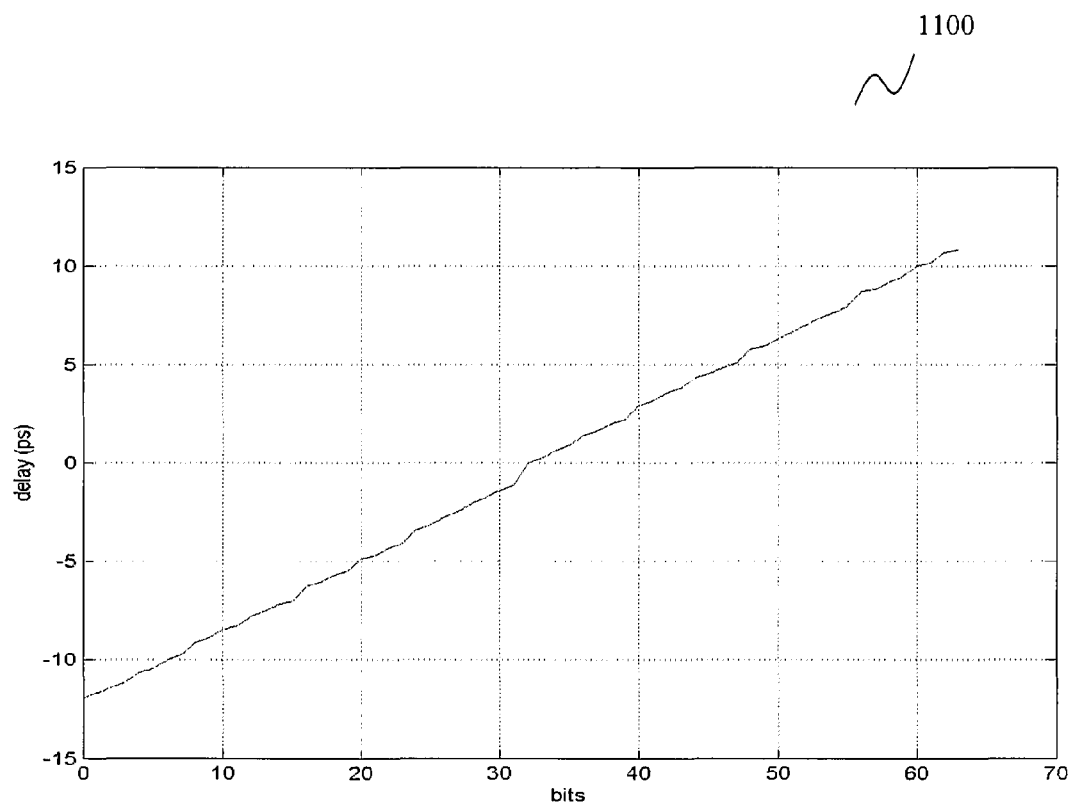
FIG. 11 shows a graph of the relative delay plotted against the control bits settings obtained for the fine calibration unit according to one embodiment of the invention.

FIG. 11 shows a graph of the relative delay plotted against the control bits settings obtained for the fine calibration unit 209 according to one embodiment of the invention.

The control bits mentioned in the graph of FIG. 11 refers the $CTRL_n$ control lines used in the capacitor stages 803 of the capacitor array 800. In this case, n ranges from 0 (binary 000000) to 64 (binary 111111).

The graph of FIG. 11 shows that the relative delay of the capacitor array 800 may be increased approximately in a linear manner with the control bits settings.

It should be noted that a smaller relative delay resolution may be achieved if the capacitance value $\Delta C_i$ is replaced by the capacitance difference in metal layers.

The proposed implementation for the fine calibration unit 209 has the following advantages. Firstly, fine delay resolution may be achieved as the parasitic capacitance from the switches and metal routings are eliminated. Secondly, the design is simple and easy to implement, since it only needs a switch which alternates between two capacitance values. Thirdly, the area of the layout is smaller if the capacitance difference were generated using different metal routings.

Embodiments of the invention may have the following effects.

Embodiments of the invention provide a flexible means for generating a plurality of signals, where the minimum phase difference (or the time delay) between signals are programmable. Such flexibility allows the same design/apparatus to be reused or adapted for use in other systems, for example.

Further, embodiments of the invention may also be easy to implement.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An apparatus for generating a plurality of signals, comprising:
   a first signal generation unit, comprising
      an input receiving a reference signal, and
      a plurality of outputs providing a first plurality of output signals being generated based on the reference signal, wherein any two of the output signals have a different phase;
   a second signal generation unit, comprising
      at least two inputs receiving at least two signals selected from the first plurality of output signals generated by the first signal generation unit, and
      a plurality of outputs providing a second plurality of output signals being generated by interpolating the respective phases of the received at least two signals selected from the first plurality of output signals;
   a selection unit, comprising
      a first plurality of inputs receiving the first plurality of output signals generated by the first signal generation unit,
      a second plurality of inputs receiving the second plurality of output signals generated by the second signal generation unit, and
      a plurality of outputs providing the plurality of signals wherein each of the signals is selected from the first plurality of output signals generated by the first signal generation unit and the second plurality of output signals generated by the second signal generation unit,
      wherein any two signals of the plurality of signals have a different phase; and
   a calibration unit, wherein the calibration unit is programmed to compensate the minimum phase difference between any two signals of the plurality of signals, such that the minimum phase difference is at least substantially the same as a parameter value corresponding to the signals selected by the selection unit.

2. The apparatus of claim 1, wherein the first plurality of output signals is generated such that there is a phase difference between any two signals of the first plurality of output signals, and that the minimum phase difference between any two signals of the first plurality of output signals is based on a first parameter value.

3. The apparatus of claim 2, wherein the second plurality of output signals is generated such that there is a phase difference between any two signals of the second plurality of output signals, and that the minimum phase difference between any two signals of the second plurality of output signals is based on a second parameter value.

4. The apparatus of claim 3, wherein the first parameter value is greater than the second parameter value.

5. The apparatus of claim 4, wherein the first parameter value and the second parameter value are programmable.

6. The apparatus of claim 1, further comprising a buffering unit, wherein the buffering unit is adapted to control the slew rate of the plurality of signals, such that the rise/fall times of the plurality of signals are at least substantially the same as a predefined value.

7. The apparatus of claim 1, wherein the second signal generation unit comprises at least one phase interpolating circuit.

8. The apparatus of claim 1, wherein the second signal generation unit comprises a plurality of phase interpolating circuits, which are connected in series.

9. The apparatus of claim 1, wherein the number of output signals in the first plurality of output signals is the same as the number of output signals in the second plurality of output signals.

10. The apparatus of claim 1, wherein the first signal generation unit comprises a delay lock loop circuit.

11. The apparatus of claim 1, wherein the first signal generation unit comprises a phase lock loop circuit.

12. The apparatus of claim 1, wherein the selection unit comprises a multiplexer circuit.

13. A method of generating a plurality of signals, comprising:
   generating a first plurality of output signals based on a reference signal, wherein any two signals of the plurality of output signals have a different phase;
   selecting at least two signals from the first plurality of output signals;
   generating a second plurality of output signals by interpolating the respective phases of the selected at least two signals from the first plurality of output signals;
   selecting the plurality of signals from the first plurality of output signals and the second plurality of output signals, wherein any two signals of the plurality of signals have a different phase; and
   compensating the minimum phase difference between any two signals of the plurality of signals, such that the minimum phase difference is substantially the same as a parameter value corresponding to the selected plurality of signals.

14. The method of claim 13, wherein the first plurality of output signals is generated such that there is a phase difference between any two signals of the first plurality of output signals, and that the minimum phase difference between any two signals of the first plurality of output signals is based on a first parameter value.

15. The method of claim 14, wherein the second plurality of output signals is generated such that there is a phase difference between any two signals of the second plurality of output signals, and that the minimum phase difference between any two signals of the second plurality of output signals is based on a second parameter value.

16. The method of claim 15, wherein the first parameter value is greater than the second parameter value.

17. The method of claim 16, wherein the first parameter value and the second parameter value are programmable.

18. The method of claim 13, further comprising
   controlling the slew rate of the plurality of signals, such that the rise/fall times of the plurality of signals are at least substantially the same as a predefined value.

19. The method of claim 13, further comprising
   providing the plurality of signals to an antenna beamforming unit.

* * * * *